(12) United States Patent
Hershel et al.

(10) Patent No.: US 6,710,798 B1
(45) Date of Patent: Mar. 23, 2004

(54) METHODS AND APPARATUS FOR DETERMINING THE RELATIVE POSITIONS OF PROBE TIPS ON A PRINTED CIRCUIT BOARD PROBE CARD

(75) Inventors: Ron Hershel, Corvalis, WA (US); Rich Campbell, Chandler, AZ (US); Timothy S. Killeen, Redmond, WA (US); Donald B. Snow, Mercer Island, WA (US)

(73) Assignee: Applied Precision LLC, Issaquah, WA (US)

( * ) Notice: Subject to any disclaimer, the term of this patent is extended or adjusted under 35 U.S.C. 154(b) by 0 days.

(21) Appl. No.: 09/265,105

(22) Filed: Mar. 9, 1999

(51) Int. Cl.⁷ .............................. H04N 7/18; G06K 9/00; G01R 31/02
(52) U.S. Cl. .................. 348/87; 382/151; 356/243.1; 324/758
(58) Field of Search ........................ 348/87; 382/151; 356/243.1; 700/58; 324/758

(56) References Cited

U.S. PATENT DOCUMENTS

| | | | |
|---|---|---|---|
| 4,494,139 A | * 1/1985 | Shima et al. | 348/87 |
| 4,668,982 A | * 5/1987 | Tinnerino | 348/87 |
| 4,786,867 A | 11/1988 | Yamatsu | |
| 4,918,374 A | 4/1990 | Stewart et al. | |
| 4,934,064 A | 6/1990 | Yamaguchi et al. | |
| 4,999,764 A | * 3/1991 | Ainsworth et al. | 700/58 |
| 5,065,092 A | 11/1991 | Sigler | |
| 5,189,707 A | * 2/1993 | Suzuki et al. | 382/151 |
| 5,198,756 A | 3/1993 | Jenkins et al. | |
| 5,530,374 A | 6/1996 | Yamaguchi | |
| 5,537,204 A | * 7/1996 | Woodhouse | 356/243.1 |
| 5,657,394 A | 8/1997 | Schwartz et al. | |
| 6,002,426 A | * 12/1999 | Back et al. | 348/87 |

* cited by examiner

Primary Examiner—Chris Kelley
Assistant Examiner—Allen Wong
(74) Attorney, Agent, or Firm—Pillsbury Winthrop LLP (57) ABSTRACT

A probe card inspection system uses a fiduciary plate having a plurality of targets deposited thereon by photolithography and vapor deposition. A plurality of semiconductor probe card probe tips are contacted with the fiducial pattern on the plate. An electronic imaging system determines the position of geometric centroids of the probe tips with respect to an index mark in the fiducial pattern. A central processor determines the position of each imaged probe tip(s) with respect to the index mark, and calculates the relative positions of each probe tip from that data.

24 Claims, 8 Drawing Sheets

METHODS AND APPARATUS FOR DETERMINING THE RELATIVE POSITIONS OF PROBE TIPS ON A PRINTED CIRCUIT BOARD PROBE CARD

TECHNICAL FIELD

The invention relates to semiconductor test equipment. More specifically, the invention relates to semiconductor probe card analysis, rework, and scrub mark analysis stations.

BACKGROUND OF THE INVENTION

A variety of equipment and techniques have been developed to assist manufacturers of integrated circuits in testing those circuits while still in the form of dies on semiconductor wafers. In order to quickly and selectively electrically interconnect contact pads on each die to the electrical test equipment, arrays of slender wires or other contact media are provided. The contact media are arranged on conventional printed circuit boards so as to be positionable on the metalized contact pads associated with each semiconductor die. As is well known by those of ordinary skill in the art, those printed circuit board test cards have come to be known as "probe cards" or "probe array cards".

As the component density of semiconductor circuits has increased, the number of contact pads associated with each die has increased. It is now not uncommon for a single die to have upwards of 600 pads electrically associated with each die. The metalized pads themselves may have as little as a ten $\mu$m gap therebetween with an on-center spacing on the order of 50 $\mu$m to 100 $\mu$m. As a result, the slender probe wires of the probe array cards have become much more densely packed. It is highly desirable that the free ends or "tips" of the probes be aligned in a common horizontal plane, as well as have the proper positioning with respect to one another within the plane so that when the probes are pressed down onto the metalized pads of an integrated circuit die, the probes touch down substantially simultaneously, and with equal force while being on target. As used herein, the terms "touchdown", "rest" and "first contact" have the same meaning. In the process of making electrical contact with the pads, the probes are "over traveled" causing the probes to deflect from their rest position. This movement is termed "scrub" and must be taken into account in determining whether the rest position and the over travel position of the probes are within specification for the probe card.

The assignee of the present invention has developed equipment for testing the electrical characteristics, planarity and horizontal alignment, as well as scrub characteristics of various probe cards and sells such equipment under its Precision Point™ line of probe card array testing and rework stations. A significant component of these stations is a planar working surface known as a "checkplate". A check plate simulates the semi-conductor die undergoing a test by a probe card while checking the above described characteristics of the probes. A suitable check plate for use with the assignee's Precision Point™ equipment is described in detail in U.S. Pat. No. 4,918,379 to Stewart et al. issued Apr. 17, 1990, the disclosure of which is incorporated herein by reference. It is sufficient for the purposes of this disclosure to reiterate that while the subject probe card is held in a fixed position the check plate is moved horizontally in steps when testing the horizontal relative positioning, and vertically in steps when testing the touchdown contact and over travel position of each probe tip. Previously, and as described in the above-identified patent, horizontal position information for each probe tip was determined by translating an isolated probe tip in steps across resistive discontinuities on the check plate. In recent years, this technique has been altered by placing a transparent, optical window in the surface contact plane of the check plate with a sufficiently large surface dimension so as to permit a probe tip to reside thereon. An electronic camera viewing the probe tip through the window digitizes the initial touch down image of the probe, and a displaced position of the probes due to "scrub" as the check plate is raised to "over travel" the probe. The initial touch down position is compared to the anticipated touch down position to assist an operator in realigning that particular probe.

Another prior art technique for determining relative probe tip positions in a horizontal (e.g. X-Y) plane is described in U.S. Pat. No. 5,657,394 to Schwartz et al., the disclosure of which is incorporated herein by reference. The system disclosed therein employs a precision movement stage for positioning a video camera into a known position for viewing probe points through an optical window. Analysis of the video image and the stage position information are used to determine the relative positions of the probe points. In systems of this type, a "reference" probe position is determined primarily through information from the video camera, combined with position information from the precision stage. If the pitch of the probes on the probe card is small enough, two or more probes can be simultaneously imaged with the video camera. The position of this adjacent probe is then referenced with respect to the "reference" probe from information from the video camera only. The camera is then moved to a third probe, adjacent to the second probe and this process is repeated until each probe on the entire probe card has been imaged.

Each of the above probe position determining methods suffers from its own, unique limitations. The method described in the '374 patent to Stewart et al. relies heavily on the repeatability and accuracy of the stage which translates the check plate with respect to the probe pins. Although the position of each probe tip is determined uniquely with respect to a reference position of the stage, there are inherent limitations as to the resolution of the stage (i.e. the size of the smallest linear increment which a micropositioning device can move the stage under electronic control). Thus, this technique is not applicable if the desired tolerance of probe pin position is less than the resolution of the micropositioning stage.

The method disclosed in the '394 to Schwartz et al. is theoretically capable of much greater accuracy because once the position of the "reference" probe has been determined, the position of every other probe tip in the probe tip array is determined relative to one another using the resolution of the video (typically CCD) camera. Modem CCD arrays can have picture elements (i.e. pixels) having on center distances on the order of 7.0 $\mu$m or less. Thus, the resolution of this system is very high. Nevertheless, there are two principle limitations involved with this technique. The first limitation relates to a small error associated with each measurement made by the CCD array. These errors are cumulative for each subsequent probe measured in sequence. Thus, in an array comprising 600 or more probes, the positional measurement error of the 600th probe can be quite large. An obvious solution to this problem is to provide a CCD array which is capable of imaging all of the probe tips simultaneously. Unfortunately, the size of printed circuit probe card arrays (i.e. the number of probe tips per probe card) is increasing more rapidly than is the size of CCD arrays. As is well known to those of ordinary skill in the semiconductor manufacturing art, the difficulty in manufacturing larger semiconductor dies increases geometrically with the area of the die, whereas the ability to increase the pitch of printed circuit probe cards is not thusly constrained. The second limitation relates to the inherent accuracy of the optical system which forms the image of the probe pin tips. The '394 patent does not disclose any technique for compensating for optical aberrations or alignment in accuracy in the optical system.

In an attempt to address the problems outlined above, the assignee of the present invention manufactures a probe card analysis and rework station under the designation PRVX™ which uses a video technique to image printed circuit probe card array probe tips while referencing each measurement to the position of the stage rather than an adjacent probe tip. Thus, the Cartesian horizontal position determination of each probe is equally accurate. Nevertheless, modern printed circuit probe cards having probe densities exceeding 600 probes are approaching the limits of resolution of such a hybrid system. It is clear that at some point, both the size of printed circuit probe card arrays and the pitch density of probe tips will exceed the capabilities of such systems. In addition, as described above there are inherent mechanical limitations to the accuracy, repeatability, and resolution of the mechanical stages on which all of the prior art systems rely at some point during the mensuration process. For example, mechanical systems of this type are inherently subject to dimensional changes due to temperature fluctuations, mechanical wear, friction, and the like. To some extent, these variables can be compensated by numerical methods or position encoders. Nevertheless, a need exists for a printed circuit probe card analysis system having improved resolution, accuracy and repeatability over time.

SUMMARY OF THE INVENTION

It is therefore an object of the present invention to provide a method and apparatus for determining the relative positions of probe tips in a probe card array having high resolution, repeatability and accuracy.

It is a further object of the present invention to provide a method and apparatus for determining the relative position of probes in a probe card array which is not dependent on the accuracy of a mechanical stage.

It is yet another object of the present invention to achieve the above objects in a method and apparatus for determining the relative positions of probes in a probe card array which requires a minimum number of touchdowns of individual probe tips on a probe card checkplate.

The invention achieves these objects, and other objects and advantages which will become apparent from the description which follows, by providing a probe card inspection system having a fiduciary or fiducial plate including a plurality of regularly positioned, optically perceptible fiduciary marks thereon. The marks are spaced apart at regular intervals. Those intervals can be substantially greater than an anticipated size of a typical probe tip or approximately the same as the anticipated distance between the probe tips. The system includes an electronic imaging device having a plurality of imaging elements arranged in an addressable array. Each imaging element is substantially smaller than the anticipated size of an image of a probe card probe tip. The electronic imaging device, such as a charge coupled device array forms a magnified image of the fiduciary marks and one or more probe tips in contact with a contact surface in the vicinity of the fiduciary marks. An image processor addresses each of the imaging elements to determine the position of one or more probe tips in the probe card array with respect to the fiduciary marks.

In the preferred embodiment of the invention, the position of a first probe tip is determined with respect to an index mark on the fiduciary plate. The position of a subsequent probe tip with respect to an adjacent fiduciary mark is then determined. The position of each fiducial mark with respect to the index mark is known (such as by electronically counting fiduciary marks). Therefore the positioning of each probe tip is therefore determined relative to the index mark on the fiduciary plate. From this information, the relative position of each probe tip can be obtained with respect to one another with minimum measurement error, rather than with respect to an external reference such as the position of a precision stage or other device which translates the electronic imaging device. To the extent that the electronic imaging device is not sufficiently large to image all of the probes simultaneously, the imaging device is translated horizontally with respect to the fiduciary plate to image each of the probe tips.

In the preferred embodiment of the invention, the fiduciary marks can be positioned so as to be substantially co-planar with a contact or touchdown surface on the fiduciary plate. In an alternate embodiment, the fiduciary marks can be positioned in a plane parallel to but displaced from the contact surface. In this alternate embodiment, the surface having the fiduciary marks and the contact surface may each be illuminated by monochromatic light sources of different wavelengths pre-selected so as to provide an image of the contact surface and the surface having the fiduciary marks in a common focal plane. Preferably, the fiduciary marks are ion or acid etched directly into a sapphire plate or are deposited by vapor deposition in accordance with photolithographic techniques.

The inspection system in the preferred embodiment is also provided with an image capture device having electronic circuitry and/or a microprocessor and computer program for compensating for magnification of the image of the fiduciary marks and rotation or distortion of the image of the fiduciary marks with respect to the electronic imaging device.

In the method of preferred embodiment, the electronic imaging device is translated with respect to the fiduciary plate by an electromechanical stage, and the fiduciary plate is provided with an index mark. The identity of each fiduciary mark with respect to the index mark is obtained from gross positional information from the electromechanical stage, or by electronically counting the passage of each fiduciary mark past the imaging device. In a second step, the position of the geometric centroid of each probe tip is determined with respect to adjacent fiduciary marks from picture element (pixel) information from the electronic imaging device. This positional information is integrated with the positional information of the adjacent fiduciary marks to precisely determine the absolute position of the centroid of a probe tip of interest with respect to the index mark. This process can be repeated for subsequent probe tips such that the position of each probe tip with respect to the designated index mark on the fiduciary plate is known. By corollary, the relative position of each measured probe tip with respect to one another is also known.

In another alternate embodiment of the invention, an aluminized silicon wafer is "scrubed" during a hot scrub test by a probe card using a device called a "prober". The hot scrub test prepares a series of trough like markings on an aluminized semiconductor die. These markings are then analyzed by the apparatus through the inventive fiduciary plate. This information is useful for the design, repair and calibration of probe cards.

DETAILED DESCRIPTION OF THE PREFERRED EMBODIMENTS

Figure 1:
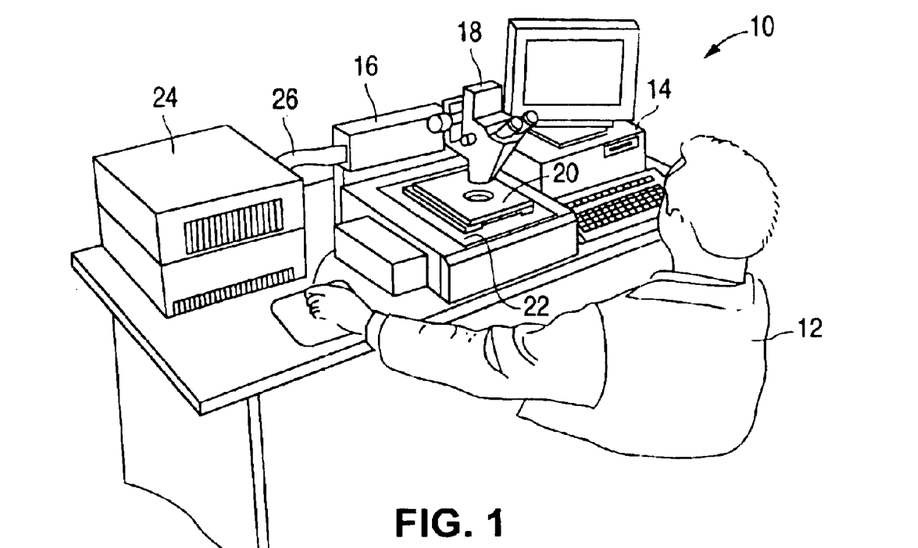
FIG. 1 is an environmental, perspective view of a semiconductor probe card analysis and rework station employing the probe card inspection system of the present invention.

A semiconductor probe card analysis and rework station employing the present invention is generally indicated at reference numeral 10 in FIG. 1. The station is in use by an operator 12. The station includes a personal computer 14 for monitoring and operating an electromechanical unit 16 for inspection and rework of a semiconductor printed circuit probe card (not shown). The electromechanical unit 16 includes a microscope 18, a carrier 20 for the semiconductor probe card and an orthogonal motion stage 22. The rework station 10 further includes a signal processing apparatus 24, electrically interconnected with the electromechanical unit 16 and computer 14 by a multi conductor cable 26. The operator 12 can control the motion of the orthogonal motion stage 22 and conduct various tests on a probe card contained in the probe card carrier 20 through the personal computer 14.

Figure 2:
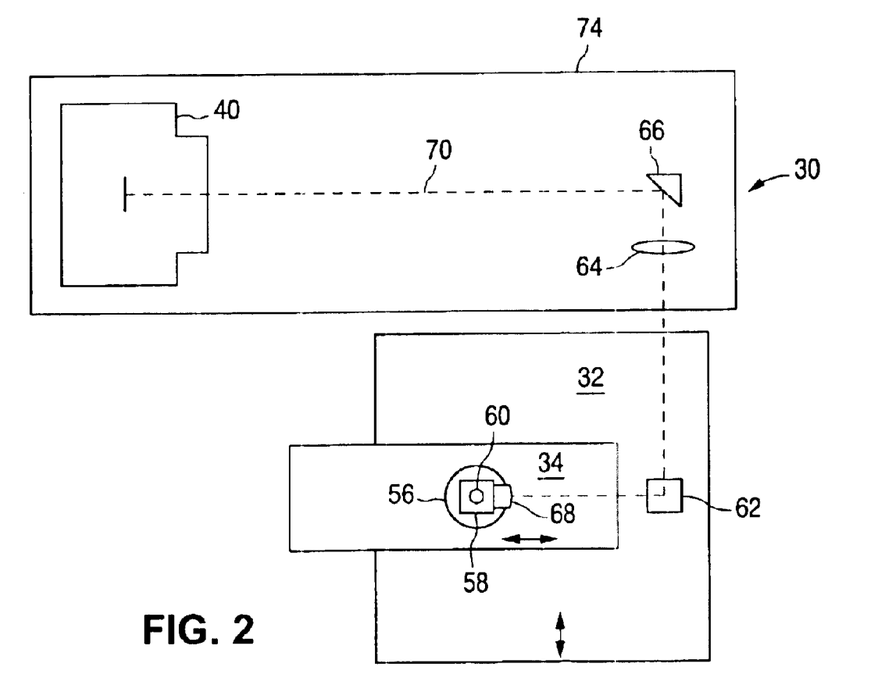
FIG. 2 is a schematic, top plan representation of the probe card inspection system.
Figure 3:
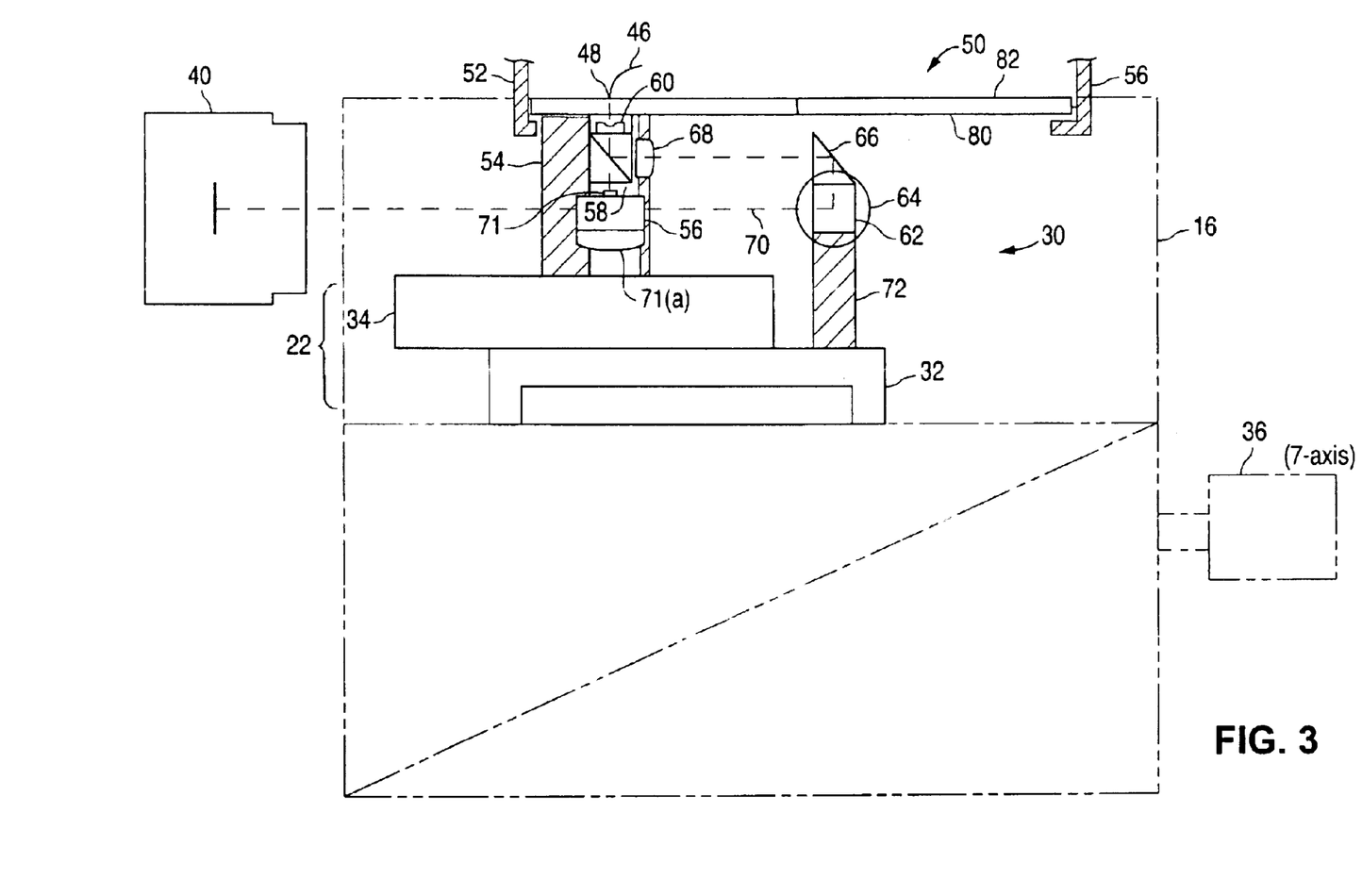
FIG. 3 is a schematic, front elevational view of the probe card inspection system.
Figure 4:
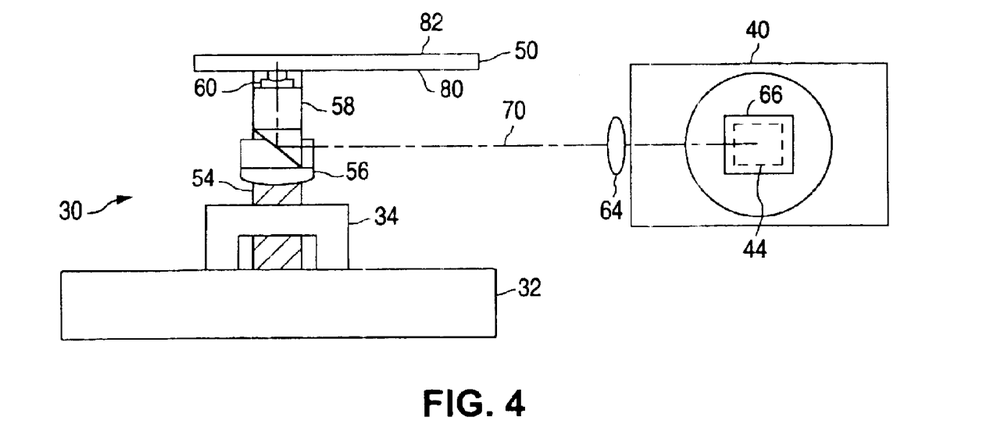
FIG. 4 is a schematic, side elevational representation of the probe card inspection system.

The electromechanical unit 16 incorporates a probe card inspection system of the present invention generally indicated at reference numeral 30 in FIGS. 2 through 4. The system includes an X-axis carrier 32 and a Y-axis carrier 34 comprising the orthogonal motion stage 22. An appropriate stage including controlling circuitry and software is available under a variety of model designations from Applied Precision, Inc., Issaquah, Wash., the assignee of the present invention. The orthogonal motion stage 22 further includes a Z-axis carrier schematically represented at reference numeral 36 for positioning the X and Y axis carriers in a vertical direction.

The probe card inspection system 30 has an electronic imaging device 40 including a charge coupled device (hereinafter CCD) 44 having an 768×493 pixel array for imaging tips 48 of probes 46 on a fiduciary plate 50. An appropriate electronic imaging device is manufactured by Sony Corporation, Japan under the model designation XC-77BB.

The probe card (not shown) is releasably connected to the probe card carrier 20 and suspended rigidly over fiduciary plate 50. The electronic imaging device 40 creates an electronic image of the tip 48 of the probe 46, and also of a pattern which is preferably lithographically applied to the fiduciary plate 50 as will be described in further detail herein below. The resulting image is subsequently processed by the signal processing apparatus 24 and personal computer 14. To this end, the Y-axis carrier 34 supports an optical frame member 54 having a quasi-monochromatic illuminator 56, a dark field beam splitting prism 58 and a field lens 60 which together define a vertical optical axis. A second, transverse optical axis 70 is defined by the electronic imaging device 40, a first prism 62, a main imaging lens 64, a second prism 66 and a focusing lens 68. The focusing lens 68 directs the horizontal optical axis 70 into a dark field beam splitting prism 58 through the field lens 60 onto the fiduciary plate 50 and tip 48 of the probe 46. The illuminator 56 includes an LED 71 having a wavelength of 624 nm, focused by a spherical mirror 71 (a), through the beam splitter 58 and onto the fiduciary plate 50.

Figure 3A:
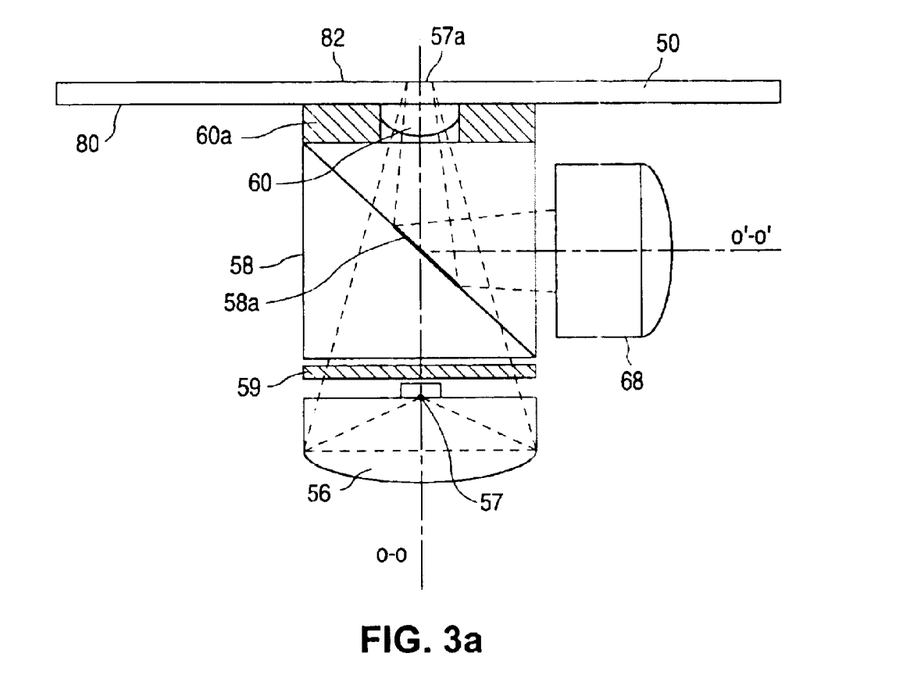
FIG. 3a is an enlarged schematic representation of part of an optical sub-system of the present invention.

By way of further description and with reference to FIG. 3a, a magnified image of the LED emitting surface 57 is formed on the top (outer) surface 82 of the fiduciary plate 50 by a concave mirror group 56. A mild diffuser 59 smooths out this image to produce a uniform illumination of the probe tips over a specified area. The diagonal of the beamsplitter 58 is uncoated except for an aluminized area 58a near the center. Light from 56 passes around 58a to the fiduciary plate. If no probe tip or fiduciary marks are present, the light reflected from surface 82 passes around 58a and no light is reflected from 58a to the objective lens 68. With marks or tips present, light is scattered into 58a which is then directed to the camera 40. This implementation is one form of dark field imaging. The field lens 60 sits in a Teflon housing 60a which acts as a bearing to the lower surface 80 of the fiduciary plate 50 and helps to maintain focus as the optics shown in FIG. 3a are translated along the lower surface 80 of the fiduciary plate 50. The field lens facilitates the dark field imaging by establishing the aluminized area 58a as the pupil for the imaging optics. As a result, reflected illumination from any plane surface appearing above the spherical surface of lens 60, which is perpendicular to the optical axis 0—0, entirely misses the mirrored aperture 58a and does not pass on to the camera. The fact that the pupil lies on the prism diagonal and is therefore tilted to the optical axis does not impair the dark field properties. Such surfaces include the fiduciary plate surfaces 80 and 82 and the piano side of lens 60. The optical axes 0—0 is reflected by 58a to 0'—0' which passes through the center of lens group 68, which images the fiduciary plate surface 82 at infinity.

The first prism 62 comprise a pair of right angle prisms and is supported with respect to the X-axis carrier 32 on a support 72. The electronic imaging device 40, second prism 66 and main imaging lens 64 are fixed with respect to an external frame member 74 as seen in FIG. 2. Considering that the Y-axis frame 34 is moveable with respect to and rests upon the X-axis frame 32, it will be apparent to those of ordinary skill in the art that the horizontal optical axis 70 (hereinafter referred to as the probe tip image axis) remains collimated during independent movement of the X axis and Y axis carriers. A Z-axis carrier schematically represented at reference numeral 36, vertically positions the field lens 60 in contact with a lower surface 80 of the fiduciary plate 50 for imaging the probe tip 48. Thus, in this preferred embodiment a group of probe tips can be imaged and measured without moving the probe tips relative to the fiduciary plate. In addition, the Z-axis carrier can be used to provide an air gap between the fiduciary plate and the field lens. A two thousand of an inch air gap can be maintained by a bearing surface in the shape of a ring 60 to avoid abrasia of optical surfaces 60 and 80. The optical frame member 54 can also be spring loaded against the lower surface 80 of the fiduciary plate to maintain the 2 thousands of an inch gap.

As will be well understood by those of ordinary skill in the art, depending on the size of the CCD array 44, the pitch (i.e. density) of probes 46 on the printed circuit probe card (not shown), and the magnification factor of the probe tip image axis 70, one or more probe tips 48 can be simultaneously imaged by the electronic imaging system 40. If the above factors are not selected so as to image all of the probe tips simultaneously, then the orthogonal motion stage can appropriately position the field lens 60 such that the electronic imaging device 40 can image each probe tip, or groups of probe tips sequentially. In addition, the focusing lens 64 can be selected with a variety of different focal lengths to permit electronic imaging of all, or less than all of the probe tips simultaneously in a manner well known to those of ordinary skill in the art.

Figure 5:
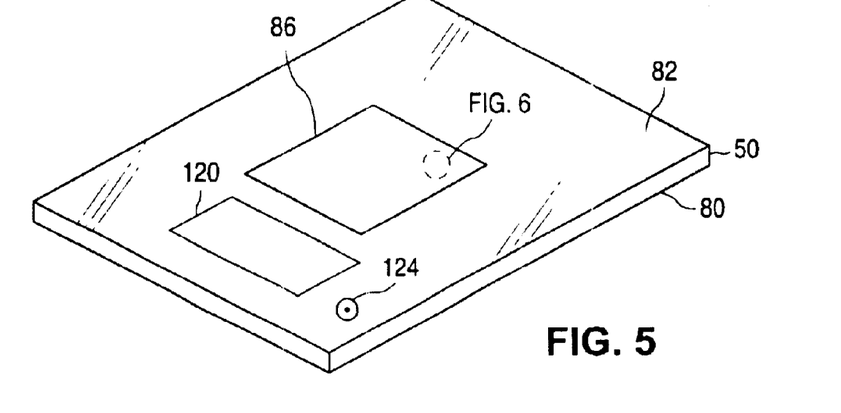
FIG. 5 is an isometric, perspective view of a fiduciary plate used by the probe card inspection system.
Figure 6:
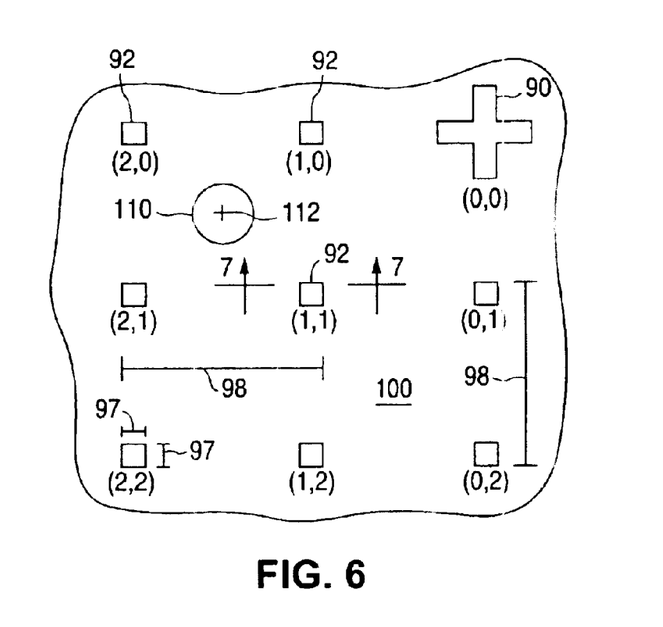
FIG. 6 is an enlarged, schematic representation of circled area 6 of FIG. 5.
Figure 7:
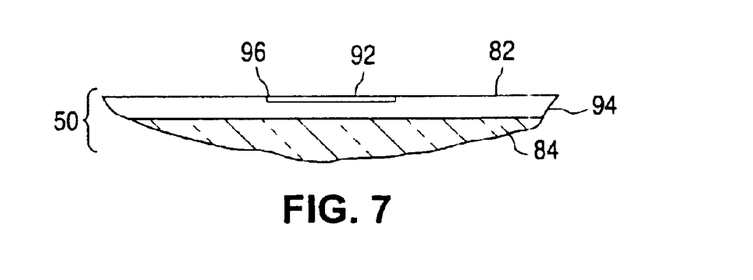
FIG. 7 is an enlarged, partial, sectional view taken along line 7—7 of FIG. 5 illustrating the topology of the fiduciary plate.

The fiduciary plate 50 as shown in FIGS. 5 through 7 has a lower surface 80 for contacting the field lens 60, and an upper contact surface 82 for contacting one or more of the probe tips 48. The fiduciary plate has a substrate 84 preferably made from optical quality glass, quartz or sapphire crystal. A centrally located, rectangular area 86 has a repeating pattern imbedded therein such as by photolithographic vapor deposition.

The enlarged area shown in FIG. 6 illustrates a preferred embodiment of this repeating pattern consisting of an index mark 90 and a plurality of fiduciary targets or marks 92 as arranged in a two dimensional array mathematically represented by Cartesian coordinates (X, Y) wherein the index mark 90 is identified at coordinate (0,0). In the preferred embodiment, the fiduciary plate consists of a single sheet of optical quality glass, quartz or sapphire. As best seen in FIG. 7, in an alternate embodiment of the invention, the upper contact surface 82 of the fiduciary plate 50 consists of a square depression 96 approximately 900 angstroms deep etched into the plate such as by an acid etch step. The fiduciary mark 92 is then deposited in a metalization step so as to fill the depression 96. A preferred metal for fiduciary mark 92 is chrome. The resulting upper contact surface 82 has a surface flatness of approximately 2 waves per 25.4 mm. at 632.8 nm. Optionally, a nitride coating one quarter of the wavelength of the monochromatic light source 56 may be deposited over the entire rectangular area 86 to achieve a uniformly smooth surface.

As shown in FIGS. 6 and 7, the fiduciary marks 92 are square islands of a hard metal having a length 97 and width 97 of approximately 2.25 $\mu$m, spaced apart at an on center separation interval 98 of 25 $\mu$m. The area 100 between the fiduciary marks 92 is preferably optically transparent so that a probe tip 48, or plurality of probe tips can be imaged through the lower surface 80 and upper surface 82 by the first focusing lens 60. A typical semiconductor probe card probe 46 is manufactured from a relatively hard material such as tungsten. The tip 48 of a typical probe 46 when in new condition can have a curved surface forming a spherical section. A probe tip of the type described may typically have a radius of curvature of 80 $\mu$m and a cross sectional width of 20 $\mu$m. In use, the surface of the probe tip 48 tends to be less spherical due to either wear or cleaning processes used to remove oxide which has built up on the probe tip due to multiple touchdowns on aluminum oxide surfaces. As a result, the surface of the probe tip tends to approximate a circular or elliptical flat surface, the major dimension of which tends not to exceed 20 $\mu$m. Thus, when a probe tip 48 is in contact with the rectangular area 86 defining the viewing surface of the probe card inspection system 30, the probe tip will either fit between the fiduciary marks 92, or possibly covering one but not two or more fiduciary marks. As a result, a digital image of one or more probe tips 46 of interest, superimposed on the pattern shown on FIG. 6 is generated in the electronic imaging device 40. This image is processed in the signal processing apparatus 24 and personal computer 14 for analysis. The signal processing apparatus includes an appropriate video capture board such as one manufactured by Matrox Graphics, Inc, Montreal, Canada under the model designation Pulsar.

In use, the user 12 positions a printed circuit probe card (not shown) having a plurality of probes 46 in the probe card carrier 20. The fiduciary plate 50 is then positioned with the upper contact surface 82 in contact with the probe tips so that the probe tips reside on the rectangular area 86. The clamps 52 are then adjusted so as to depress the probes 46 into either their touchdown or "over travel" positions in a manner well known to those of ordinary skill in the art. Clamps 52 may be adjusted by thumb screws or the like (not shown) with a rigid shim between the probe card and the probe card carrier 20. The operator 12 can use the microscope 18 for assistance in this procedure. In addition, the vertical range of displacements of multiple probe tips 48 from an ideal horizontal plane can be predetermined through the use of a variety of prior art techniques and devices such as those described in U.S. Pat. No. 4,918,374 to Stewart et al. or, U.S. Pat. No. 5,657,394 to Schwartz et al., the disclosures of with are incorporated herein by reference.

Once the probe tips 48 have been positioned in contact with the upper contact surface 82 in the vicinity of the rectangular area 86 such that all of the probe tips are either in their "over travel" or touchdown mode, the orthogonal motion stage 22 is operated so as to bring the index mark 90 into view. The operator or system 30 then identifies a first probe tip for analysis with respect to the index mark. That is, a probe tip which is preferably closest to the index mark 90 is identified and the orthogonal motion stage 22 is operated to position the image thereof within the CCD array 44. The resulting image can be displayed on the personal computer 14 and viewed by the operator 12. By way of example, the system 30 may generate a probe tip image 110 shown in FIGS. 6 and 9 which is between targets (2,0); (1,0); (2,1); and, (1,1). In this hypothetical example, the relative positions of those four fiduciary targets 92 are known with a high degree of precision with respect to the index mark 90 by virtue of the photolithographic precision with which the targets 92 and index mark 90 have been deposited on the fiduciary plate 50. Accuracies well below 1 $\mu$m are routinely available with these techniques.

The system 30 next determines the relative position of the probe tip image 110 with respect to the four fiduciary targets identified above. A typical CCD array has adjacent pixels having an on center distance of approximately seven to twelve $\mu$m. Thus, at an imaging system magnification of 20×, there are approximately 50 pixels between each fiduciary mark 92. Stated another way, depending on the magnification of the imaging axis 70, the image of the above four identified fiduciary targets and probe tip image 110 on the CCD array 44 covers a 50×50 array of pixels. Preferably, the image is magnified approximately 20 times before it is focused on the CCD array 44. A two dimensional graph of the image intensity amplitude versus pixel position renders a two dimensional, distribution of the probe tip image 110. The mathematical centroid 112 of this distribution can readily be determined by a technique that is well known to those of ordinary skill in the art as "blob analysis" and is preferably implemented in software in the personal computer 14. An appropriate image analysis software package for this centroid calculation is available from Matrox Graphics, Inc., Montreal, Canada. The same technique is used to determine the pixel position of the index mark 90 and targets 92. The distance between pixels being known with a high degree of accuracy, the distance between the probe tip image centroid 112 and index mark 90 is calculated. The operator or system 30 may then select any other probe tip in contact with the rectangular area 86 for subsequent position determination, again with respect to the index mark 90. As used herein, the term "centroid" includes the mathematical center of a probe tip image, the center of the area of contact of the probe tip with the fiducial plate, or the center of the intensity of the probe tip image, or any other predetermined unique location on the probe tip.

If a low magnification factor is used in the probe tip image axis 70, the positions of multiple probes can be determined simultaneously by performing the previously described analysis on the entire image. In the alternative, the orthogonal motion stage 22 can be operated to position the field lens 60 beneath a smaller group of probe tips or a single probe tip 48. As is apparent to those of ordinary skill in the art, the system 30 does not reference the position of any of the probes to the orthogonal motion stage 22, the probe card carrier 20, or any point of reference outside of rectangular area 86. In addition, the relative positions of probe tips 48 with respect to one another is mathematically determined for each probe tip relative to the index mark 90, or, in the alternative a selected one of the fiduciary targets 92. It is to be understood that although a dedicated index mark 90 in FIG. 6 has been shown as the preferred embodiment, any target 92 can be used as an "index mark" by the system 30 provided that its cartesian location is uniquely stored by the system 30. Thus, the accuracy of the system is entirely based upon the accuracy of the photolithographically located targets 92 and does not rely on the accuracy of the orthogonal motion stage 22 or any other mechanical apparatus in the system. Furthermore, because the probe tips are measured with respect to the coordinate system defined by the fiducial plate, slight stage yaw movement vs. the fiducial plate an/or slight optical magnification errors are automatically eliminated if a minimum of 4 fiducial marks bound the probe tip within the image on the CCD array. For this reason, system 30 can achieve an accuracy exceeding ±0.6 $\mu$m. This accuracy is only limited by the state of the art of photolithography, and will improve with that technology. In addition, the system is relatively unaffected by mechanical wear, temperature variation and the like because all of the system' accuracy is embodied in the fiduciary plate 50. If the substrate 84 is manufactured from a material having a low coefficient of thermal expansion, and from a mechanically rigid material, such as quartz or sapphire, the system will remain accurate over a wide temperature ranges, and over time as well.

The system can however suffer from inaccuracies in the optical system defined by the probe tip image axis 70. For example, under different magnification factors the rectangular area 86 can be optically distorted such as by a "pin cushion" effect that is schematically represented in an exaggerated form in FIG. 8. As illustrated by this example, a group of four fiduciary targets such as those shown in the area identified by the legend "FIG. 9" in FIG. 8 may appear rotated with respect to the rectilinear array of pixels in the CCD array 44. In addition, if a magnification factor other than unity is employed in the image axis 70, a scaling factor must be applied during the mathematical analysis of the image on the CCD array 44.

Figure 9:
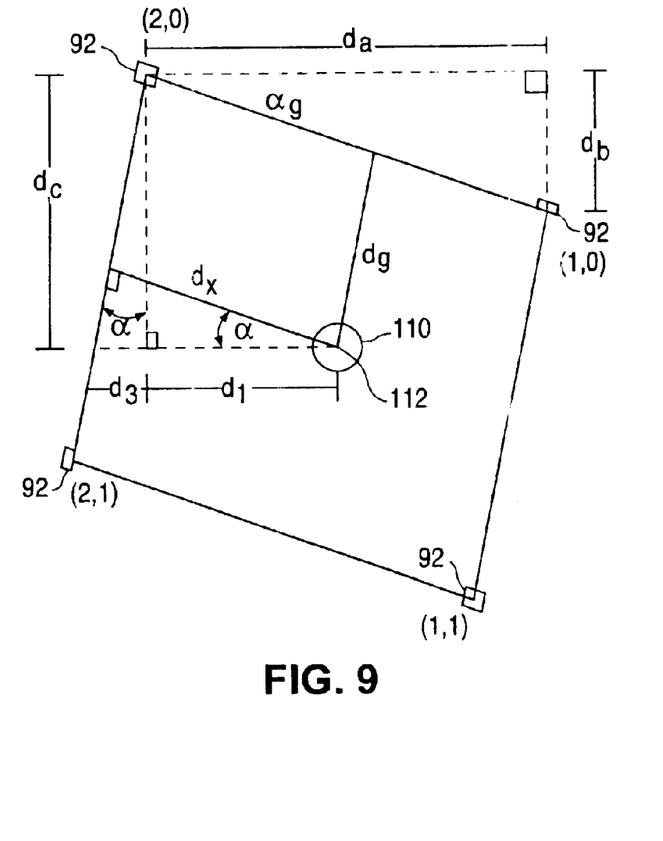
FIG. 9 is a mathematical representation of the area indicated in FIG. 8.

FIG. 9 demonstrates a preferred method for correcting the apparent rotation of fiduciary targets 92 with respect to the CCD array 44 and for accurately determining the horizontal and vertical (e.g. X,Y) position of the geometric centroid 112 of the probe tip image 110. As will be appreciated by those of ordinary skill in the art, simple right angle geometry provides a mathematical means for correcting the apparent rotation of the fiduciary target 92 array with respect to the CCD array 44 where a represents the rotation angle:

$$\text{Tangent}\alpha = [d_b/d_a]$$

Wherein $d_a$ represents the projected X-pixel displacement between targets (2,0) and (1,0) on the CCD array 44, and $d_b$ represents the projected Y-displacement of fiduciary target (2,0) and (1,0) with respect to the corresponding row of pixels on the CCD array 44. The scale factor of the image is equal to the product of the cosine of the rotation angle $\alpha$ and the ratio of the X-distance between fiduciary targets ($d_{grid}$) 92 and the distance between corresponding pixels (d pixel) on the CCD array 44 in the ideal case where the target array and CCD array are aligned under unity magnification. That is:

$$\text{Scale } (\mu\text{m/pixel}) = \cos(\alpha)[d_{grid}/d_{pixel}]$$

Using the above, and with reference to FIG. 9, the horizontal distance between a line connecting fiduciary targets (2,0) and (2,1) and the geometric centroid 112 of the probe tip (e.g. $d_x$) is given as follows:

$$d_x = \cos(\alpha)[(d_1+d_3)(\text{Scale})];$$

Wherein, $d_3=[d_2]\tan(\alpha)$; and, wherein $d_1$ and $d_2$ are measured directly by counting pixels and multiplying by the distance between pixels.

Stated another way, $d_x$ represents the horizontal displacement of the image centroid 112 from a vertical line connecting targets (2,0) and (2,1), and wherein $d_y$ represents the vertical displacement of the image centroid 112 from a horizontal line connecting fiduciary targets (2,0) and (1,0). $d_y$ calculated in a similar fashion. The above calculations can be readily programmed into the personal computer 14 in a manner well known by those of ordinary skill in the art. For additional accuracy, this process can be repeated for the other fiduciary targets, 1,0; 1,1; and 3,1; and the results averaged.

Upon reviewing this disclosure and the accompanying drawings, those of ordinary skill in the art can apply the concepts disclosed herein to alternate embodiments of the invention. For example, the preferred embodiment described above only provides relative horizontal position information of probe tips 46 in a probe card array. However, the system described above does not provide relative position information regarding the probe tips 46 in a perpendicular axis. The fiduciary plate 50 can be provided with an auxiliary, conductive touchdown area 120 for determining Z-axis probe position in a conventional manner. In this alternate embodiment, the fiduciary plate 50 can be mechanically connected to the Z axis stage 36 for independent motion with respect to the orthogonal motion stage 22 (e.g. the orthogonal motion stage is fixed to frame member 74 and is independent of the Z-axis stage). In addition, an insulated, conductive dot 124 can be provided for determining the probe tip position along the Z-axis for bussed probes in a manner well known to those of ordinary skill in the art.

Figure 8:
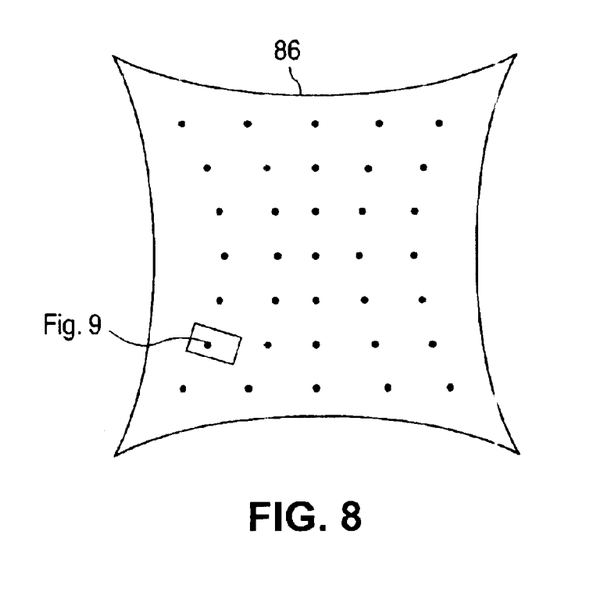
FIG. 8 is a schematic representation of an optical "pin cushion" fact of the fiduciary plate image in an electronic imaging system.

In another alternate embodiment of the invention, the fiduciary marks 92 and index mark 90 can be deposited on the lower surface 80 of the fiduciary plate 50. A second, monochromatic light source, identical to the monochromatic illuminator 56 except operating at a different wavelength is employed. By appropriately selecting the separation distance of the upper surface 82 and the lower surface 80, and correlating that separation distance with a difference in wavelength between the two light sources, the image of the upper surface 82 and lower surface 80 with the fiduciary marks 92 will coincide on the focal plane of the CCD array 44. In this manner, an identical image will be generated as shown in FIGS. 6, 8 and 9 but the fiduciary marks 92 will not be subject to wear from the over travel motion of the probe tips 48.

Figure 10:
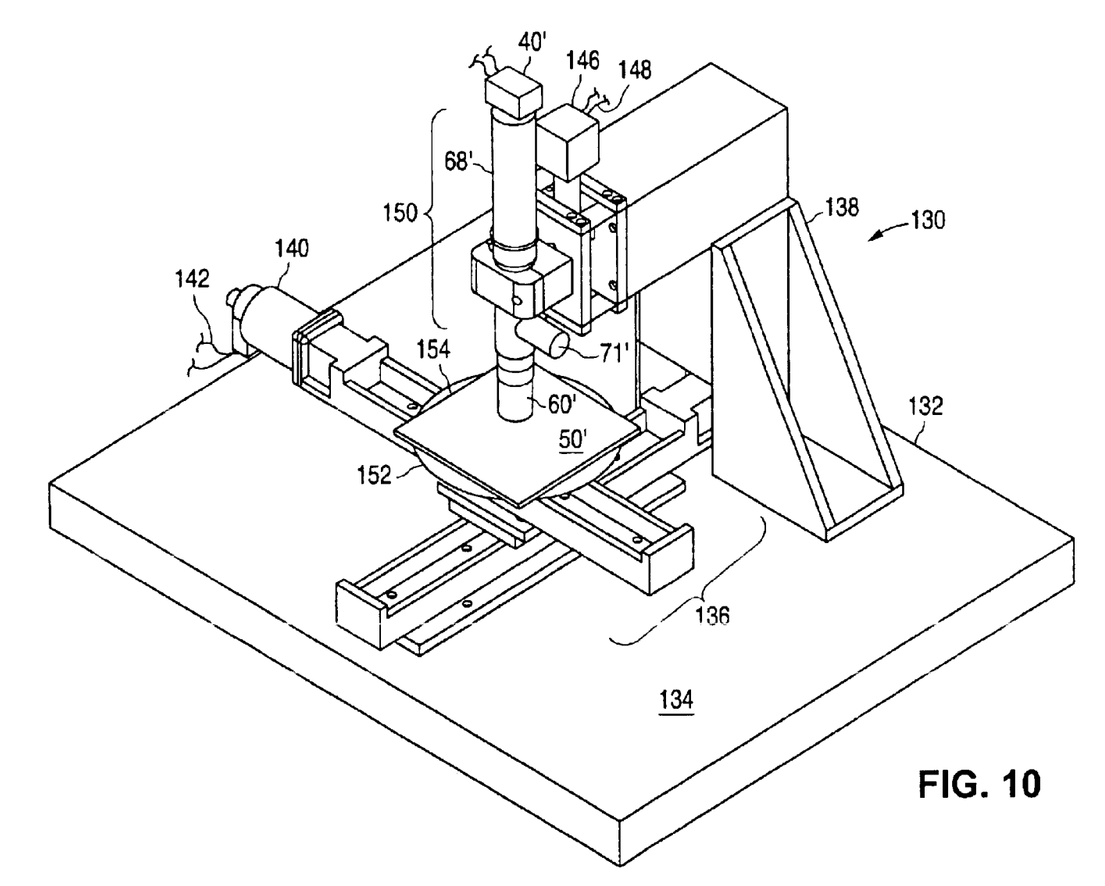
FIG. 10 is an environmental, isometric view of an alternate embodiment of the invention for determining the relative positions, sizes and orientations of scrub marks on a semiconductor wafer from a hot scrub test using the methods of the present invention.
Figure 11:
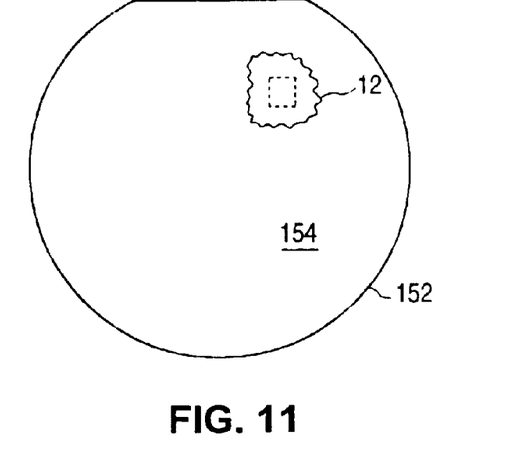
FIG. 11 is a schematic, top plan representation of an aluminized semiconductor wafer having scrub marks thereon from a hot scrub test.

An additional alternate embodiment of the invention is generally indicated at reference numeral 130 in FIG. 10. This alternate embodiment comprises a scrub mark analysis station 132 having a base member 134 an X-Y stage generally indicated at reference numeral 136 and a vertical support member 138 supported thereon. The X-Y stage has computer controlled, micropositioning motors such as 140 controlled through cables 142 in a manner well known to those of ordinary skill in the art. The vertical support member 138 has a motorized Z-axis stage 146 operated under computer control by way of cables 148 for vertically positioning a charge coupled device (CCD) electronic imaging system 150 for vertical movement with respect to the X-Y stage 136. The wafer which is support by the X-Y (not shown) stage supports a standard silicon wafer 152 which has been metalized on a substantial portion of its upper surface 154 as best seen in FIG. 11. As best seen in FIG. 11, the wafer has previously been subjected to a hot scrub test in which the silicon wafer may be raised to the operating temperature of an operational semiconductor die. Using a prober, the probe tips of the subject probe card are then touched down onto the metalized surface 154 so as to impress a series of scrub mark patterns shown in FIGS. 12 and 13 on the metalized surface thereof The scrub marks are divots or troughs dug into the surface of the metalized semiconductor wafer so as to accurately model the scrub marks which appear on the metalized bonding pads of an operational semiconductor die under test by the probe card. Two such scrub marks 160, 162 are schematically represented in FIG. 13. Each scrub mark has a starting point 164, 166 indicating the position on the wafer where each probe initially touched down on the upper surface 154. As the probe is further depressed against the upper surface, the probe tip digs an irregular trough into the metalized layer along a major axis 168, 170 to an end point 172, 174. In addition, the trough may have an irregular width defined by its minor axis 176, 178. The orientation θ, the length of the major axis 172, 174 and the width of the minor axis 176, 178, the shape of the scrub marks 164, 166 and the distance there between 180 are all important data for design, calibration, repair and rework of the semiconductor probe card, in addition to the information provided by direct analysis of the probes themselves as previously described. To this end, the alternate embodiment 130 of the invention provides quantitative data for each of the above variables by direct measurement through the use of a fiduciary plate 50' seen in FIG. 10 having a fiducial mark area 180 as best seen in FIG. 14.

The fiducial plate 50 is substantially identical to the fiducial plate 50' of the preferred embodiment and has a series of fiducial marks 92 similar to fiducial marks 92' of the preferred embodiment. An index mark 90' can also be provided.

Figure 12:
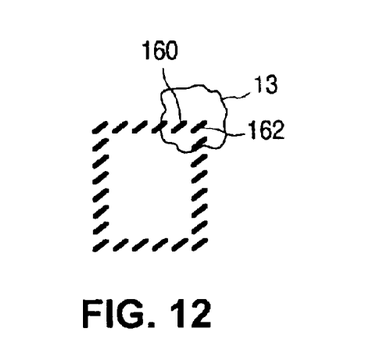
FIG. 12 is an enlarged view of circled area 12 of FIG. 11 showing scrub marks from touchdown through overtravel of a probe card.
Figure 13:
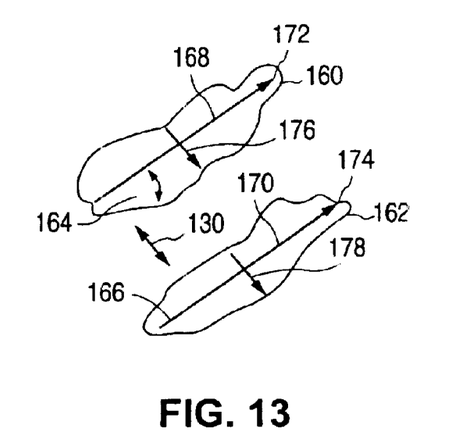
FIG. 13 is an enlarged representation of scrub marks in circled area 13 of FIG. 12.
Figure 14:
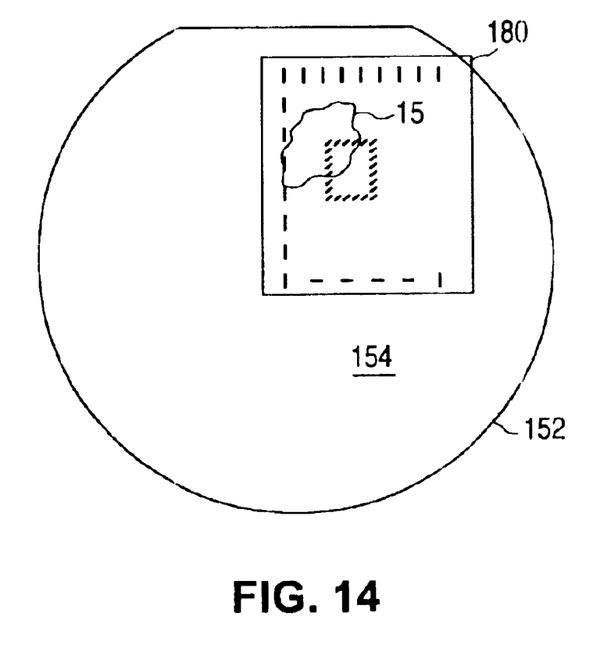
FIG. 14 is a top plan, schematic representation of the aluminized silicon wafer shown in FIG. 11 with a fiduciary plate thereon.
Figure 15:
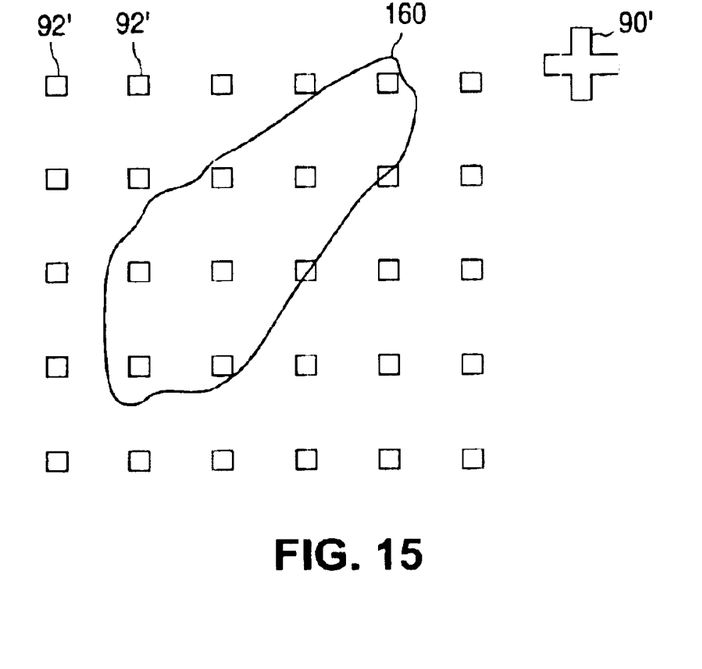
FIG. 15 is an enlarged view of circled area 15 shown in FIG. 14 of a scrub mark with fiduciary marks superimposed thereon.

In use, the fiduciary plate 50' is placed on top of the silicon wafer 152 having the hot test scrub marks as shown in FIGS. 11 through 13. This assembly is clamped, such as by microscope slide clamps (not shown) to the chuck (not shown) connected to the X-Y stage 136 shown in FIG. 10. The CCD electronic imaging system 150 has a CCD imaging device 40', and illumination source 71' an objective imaging lens 60' and an optical assembly 68' similar in form and function to a conventional microscope. The electronic imaging system 150 therefore produces an image schematically represented in FIG. 15 of one or more scrub marks, a typical one of which 160 is shown in FIG. 15 having the fiduciary marks 92', and the index mark 90' superimposed thereon. In a fashion similar to that described for the preferred embodiment, the size, shape, length, width and orientation of the scrub mark 160 can be determined with respect to the fiduciary marks 92, and/or the index mark 90'. The second, adjacent fiduciary mark 162 seen in FIG. 13 can also be imaged in this manner. The relative positions of the scrub marks, including their starting and ending points with respect to one another is thus determined. This information is valuable in designing, analyzing and/or reworking a particular probe card because it is now known how the probe card probes will react to loading when at operating temperature due to the elevated temperature of a semiconductor die during operation.

Thus, the invention is not to be limited by the above description, but is to be determined in scope by the claims which follow.

What is claimed is:

1. A probe card inspection system for determining relative positions of a plurality of probe tips having generally known sizes, and generally known positions on a probe card, comprising:

a fiduciary plate having a plurality of regularly positioned, optically perceptible fiduciary marks thereon, the fiduciary marks being spaced apart at predetermined, known intervals, the fiduciary plate defining a planar contact surface for the plurality of probe tips, and wherein the fiduciary marks and the plurality of probe tips are co-located on substantially the same plane when the probe tips are in contact with the contact surface;

an electronic imaging device having a plurality of imaging elements arranged in an addressable array, each imaging element being substantially smaller than an anticipated size of a probe tip image;

optical means for focusing an image of a plurality of the fiduciary marks and of the probe tips in contact with the contact surface onto the imaging device; and image processing means for addressing each of the imaging elements to generate an electronic image of the probe tips and of the fiduciary marks and to precisely determine a centroid of a first probe tip image and the relative distance and direction of the first probe tip image centroid from an image of one of the fiduciary marks, whereby relative positions of the first probe tip and a second probe tip when in simultaneous contact with the contact surface and imaged by the image processing means can be determined.

2. The probe card inspection system of claim 1, wherein the fiduciary marks are substantially co-planar with the contact surface.

3. The probe card inspection system of claim 2, wherein the fiduciary marks are a plurality of metalized layers vapor deposited onto the fiduciary plate by photolithographic techniques.

4. The probe card inspection system of claim 1, wherein the fiduciary marks are spaced apart substantially an anticipated size of a first probe tip in a two dimensional array.

5. The probe card inspection system of claim 4, wherein the fiduciary marks are squares having sides 2.25 µm long.

6. The probe card inspection system of claim 4, wherein the imaging elements are spaced apart in a two dimensional array on centers a distance of 10.0 micrometers.

7. The probe card inspection system of claim 1, wherein the fiduciary plate and imaging device are large enough to image a plurality of the probe tips simultaneously.

8. The probe card inspection system of claim 1, wherein the image processing means precisely determines a position of an image of the second probe tip centroid and determines the relative distance and direction of the second probe tip image from an image of a different one of the fiduciary marks.

9. The probe card inspection system of claim 1, wherein the fiduciary plate is substantially transparent.

10. The probe card inspection system of claim 9, wherein the fiduciary plate has upper and lower parallel faces, and wherein the contact surface is on the upper face and the fiduciary marks are on the lower face.

11. A probe card inspection system for determining the relative positions of substantially uniform probe tips having generally known sizes, and generally known positions on a probe card, comprising:

a fiduciary plate having a plurality of regularly positioned, optically perceptible fiduciary marks thereon, the fiduciary marks being spaced apart at regular intervals, the fiduciary plate defining a planar contact surface having an area large enough to simultaneously contact all of the probe tips, and wherein the fiduciary marks and the probe tips are co-located on substantially the same plane when the probe tips are in contact with the contact surface;

an electronic imaging device having a plurality of imaging elements arranged in an addressable array, each imaging element being substantially smaller than the anticipated size of a probe tip image;

optical means for focusing an image of at least four fiduciary marks and of a plurality of probe tips in contact with the contact surface on the imaging device; and image processing means for addressing the imaging elements to precisely determine a centroid of each of the probe tip images and relative distances and directions of the centroids of the probe tip images with respect to the fiduciary mark images, whereby the relative position of the imaged probe tips when in simultaneous contact with the contact surface is determined.

12. The probe card inspection system of claim 11, wherein the fiduciary marks are substantially co-planar with the contact surface.

13. The probe card inspection system of claim 12, wherein the fiduciary marks are a plurality of metalized layers vapor deposited onto the fiduciary plate by photolithographic techniques.

14. The probe card inspection system of claim 11, wherein the fiduciary marks are spaced apart 25 micrometers on centers in a two dimensional array.

15. The probe card inspection system of claim 11, wherein the fiduciary marks are squares having sides 2.25 µm long.

16. The probe card inspection system of claim 14, wherein the imaging elements are spaced apart in a two dimensional array on centers a distance of 10.0 micrometers.

17. The probe card inspection system of claim 11, wherein the fiduciary plate is a quartz window.

18. The probe card inspection system of claim 11, wherein the fiduciary plate has upper and lower parallel faces, and wherein the contact surface is on the upper face and the fiduciary marks are on the lower face.

19. The probe card inspection system of claim 11, wherein the fiduciary plate is substantially transparent.

20. A method for determining the relative positions of a plurality of probe tips on probes of a semiconductor probe card, comprising the steps of:

providing a fiduciary plate having a planar contact surface and a plurality of optically perceptible fiduciary marks thereon, the fiduciary marks being spaced apart at regular intervals and wherein the fiduciary marks and the plurality of probe tips are co-located on substantially the same plane when the probe tips are in contact with the contact surface;

contacting the probe tips against the fiduciary plate;

focusing an image of the fiduciary marks and of the probe tips in contact with the fiduciary plate onto an electronic imaging device having a plurality of individually addressable imaging elements;

addressing the individual imaging elements to generate an electronic image of the probe tips and the fiduciary marks; and precisely determining a centroid of each of the probe tip images and relative distances and directions of the probe tip image centroids from the fiduciary mark images, whereby the relative positions of the probe tips when in simultaneous contact with a planar surface is determined.

21. The method of claim 20, including the step of providing an index mark on the fiduciary plate, and wherein during the image element addressing step a coordinate position of the centroid of the first probe tip is determined with respect to an index mark centroid image and a coordinate position of a centroid of a second probe tip image is determined with respect to the index mark centroid image whereby a relative position of the first and second probe tip image centroids is determined with respect to one another.

22. The method of claim 20, including the step of providing an electronic imaging device having a rectilinear pixel array and compensating for apparent rotational misalignment of the fiduciary marks with the pixel array.

23. The method of claim 20, where in the plurality of probe tips forms an array larger than the fiduciary plate and wherein the fiduciary plate is moved laterally with respect to the array to contact different sub sets of probe tips with the fiduciary plate.

24. A method for determining the relative positions, sizes and orientations of scrub marks made on a metalized semiconductor wafer made in a hot scrub test, comprising the steps of:

providing a substantially transparent fiduciary plate having a planar contact surface thereon and a plurality of regularly positioned, optically perceptible fiduciary marks thereon;

positioning the semiconductor wafer in contact with the planar contact surface so that the scrub marks are visible through the fiduciary plate and so the fiduciary marks are superimposed thereon, and wherein the fiduciary marks and the scrub marks are co-located on substantially the same plane when the semiconductor wafer is in contact with the contact surface;

generating an electronic image of a scrub mark and a plurality of the fiduciary marks on an electronic imaging device having an array of imaging elements; and, addressing the imaging elements to determine size, position and orientation information concerning the scrub mark with respect to the fiduciary marks.

* * * * *